United States Patent
Wang

(10) Patent No.: US 10,390,425 B2
(45) Date of Patent: Aug. 20, 2019

(54) GOLDEN FINGER STRUCTURE

(71) Applicant: NANNING FUGUI PRECISION INDUSTRIAL CO., LTD., Nanning (CN)

(72) Inventor: Siang-Wei Wang, HsinChu (TW)

(73) Assignee: NANNING FUGUI PRECISION INDUSTRIAL CO., LTD., Nanning (CN)

( * ) Notice: Subject to any disclaimer, the term of this patent is extended or adjusted under 35 U.S.C. 154(b) by 40 days.

(21) Appl. No.: 15/498,490

(22) Filed: Apr. 27, 2017

(65) Prior Publication Data
US 2018/0316105 A1    Nov. 1, 2018

(51) Int. Cl.
 H05K 1/02    (2006.01)
 H01L 21/302    (2006.01)
 H01P 5/02    (2006.01)

(52) U.S. Cl.
 CPC .......... H05K 1/0245 (2013.01); H01P 5/028 (2013.01); *H05K 2201/09263* (2013.01)

(58) Field of Classification Search
 CPC .... H01R 12/52; H01R 12/75; H01R 23/6813; H01R 23/7068; H01K 1/0245; H01K 1/245; H01K 1/117; H01K 1/118; H01K 1/11; H01K 1/111; H05K 2201/09263; H05K 2201/9263; H05K 2201/09709; H05K 2201/9709
 USPC .............. 174/260; 439/60–62; 175/254, 255; 361/777
 See application file for complete search history.

(56) References Cited

U.S. PATENT DOCUMENTS

| | | | | |
|---|---|---|---|---|
| 3,257,629 A * | 6/1966 | Kornreich | ............... | H01P 9/006 148/100 |
| 3,736,534 A * | 5/1973 | Chaffee | .................. | H01J 29/708 315/3.5 |
| 4,313,095 A * | 1/1982 | Jean-Frederic | ..... | H01P 1/20372 333/116 |
| 4,570,136 A * | 2/1986 | Kameya | .................. | H01P 9/006 333/140 |
| 4,933,740 A * | 6/1990 | Baliga | ................. | H01L 29/0696 257/146 |
| 6,359,233 B1 * | 3/2002 | Joy | ....................... | H05K 3/0052 174/250 |
| 6,388,626 B1 * | 5/2002 | Gamalielsson | ........ | H01Q 1/243 343/700 MS |
| 6,842,148 B2 * | 1/2005 | Hendler | ................... | H01Q 1/38 343/702 |
| 6,853,335 B1 * | 2/2005 | Yeh | .......................... | H01Q 1/38 343/700 MS |
| 6,914,567 B2 * | 7/2005 | Trumbull | ................. | H01Q 1/38 343/700 MS |

(Continued)

FOREIGN PATENT DOCUMENTS

CN    102724809 A    10/2012
CN    103635018 A     3/2014
(Continued)

*Primary Examiner* — Edwin A. Leon
*Assistant Examiner* — Milagros Jeancharles
(74) *Attorney, Agent, or Firm* — ScienBiziP, P.C.

(57) ABSTRACT

A golden finger structure includes a golden finger set on a substrate, a transmission line coupled to the golden finger, and slots set on each golden finger. Adjacent slots are arranged in a opposite direction and reduce impedance discontinuity from the transmission line.

15 Claims, 10 Drawing Sheets

(56) References Cited

U.S. PATENT DOCUMENTS

| | | | |
|---|---|---|---|
| 7,045,466 B2* | 5/2006 | Subramanian | B81C 1/00626 257/E21.235 |
| 7,405,634 B2* | 7/2008 | Mobley | H05K 1/0242 333/1 |
| 7,408,512 B1* | 8/2008 | Rodenbeck | H01Q 1/2208 343/700 MS |
| 7,416,201 B2* | 8/2008 | Davey | B60G 3/14 280/124.126 |
| 7,453,338 B2* | 11/2008 | Aronson | H01R 23/688 333/260 |
| 7,557,413 B2* | 7/2009 | Chen | H01L 23/5228 257/355 |
| 8,168,497 B2* | 5/2012 | Simin | H01L 29/41758 438/270 |
| 8,228,236 B2* | 7/2012 | Birnbaum | G06K 19/07749 340/572.7 |
| 8,704,729 B2* | 4/2014 | Tucek | H01Q 9/27 343/700 MS |
| 9,035,712 B2* | 5/2015 | Regnier | H05K 1/0233 333/12 |
| 9,413,069 B2* | 8/2016 | Chieh | H01Q 1/38 |
| 9,575,607 B2* | 2/2017 | Hung | H05K 1/11 |
| 9,627,735 B2* | 4/2017 | Wakabayashi | H01P 3/08 |
| 9,755,609 B2* | 9/2017 | Korony | H03H 7/17 |
| 9,788,419 B2* | 10/2017 | Lam | H05K 1/0245 |
| 2003/0025573 A1 | 2/2003 | Pchelnikov | |
| 2003/0146808 A1* | 8/2003 | Merrill | H01P 9/006 333/161 |
| 2008/0169125 A1* | 7/2008 | Hsu | H01R 23/688 174/263 |
| 2009/0102580 A1* | 4/2009 | Uchaykin | H01P 1/2039 333/185 |
| 2012/0271580 A1* | 10/2012 | Bartling | G06F 3/041 702/65 |
| 2012/0319967 A1* | 12/2012 | Tsai | G06F 1/1626 345/173 |
| 2015/0065840 A1* | 3/2015 | Bailey | A61B 5/6802 600/384 |
| 2015/0380796 A1* | 12/2015 | Yoshida | B82Y 30/00 343/700 MS |
| 2016/0105950 A1* | 4/2016 | Drzaic | B05D 3/002 174/251 |
| 2017/0308192 A1* | 10/2017 | Ogura | G06F 3/041 |
| 2018/0031441 A1* | 2/2018 | Wong | G01M 7/08 |
| 2018/0048094 A1* | 2/2018 | Cornelius | H01R 13/6473 |

FOREIGN PATENT DOCUMENTS

| | | |
|---|---|---|
| CN | 204335143 U | 5/2015 |
| CN | 106686882 A | 5/2017 |

* cited by examiner

GOLDEN FINGER STRUCTURE

FIELD

The subject matter herein generally relates to a golden finger.

BACKGROUND

Printed circuit board (PCB) is the hardware support of electronic products and an important part of signal transmission. Since the width of a golden finger (edge connector) device in the PCB is less than the width of the transmission line, the impedance of the golden finger is usually much lower than the impedance of the transmission line, which leads to impedance discontinuity, resulting in signal reflection, and seriously affecting the signal quality.

Traditionally, the reference plane below the golden finger is dug out to avoid impedance discontinuities. The impedance of the golden finger is increased in accordance with the golden finger vertical reference or horizontal reference plane being deepened, accordingly to achieve impedance matching.

However, since the reference plane below the golden finger is dug out, the impedance of the golden finger is not easy to control and the PCB thickness is inconsistent. Furthermore, since the reference plane below the golden finger is dug out, the reference plane can not wire any signals, thus area of the wiring is reduced.

BRIEF DESCRIPTION OF THE DRAWINGS

Implementations of the present technology will now be described, by way of example only, with reference to the attached figures.

DETAILED DESCRIPTION

Figure 1:
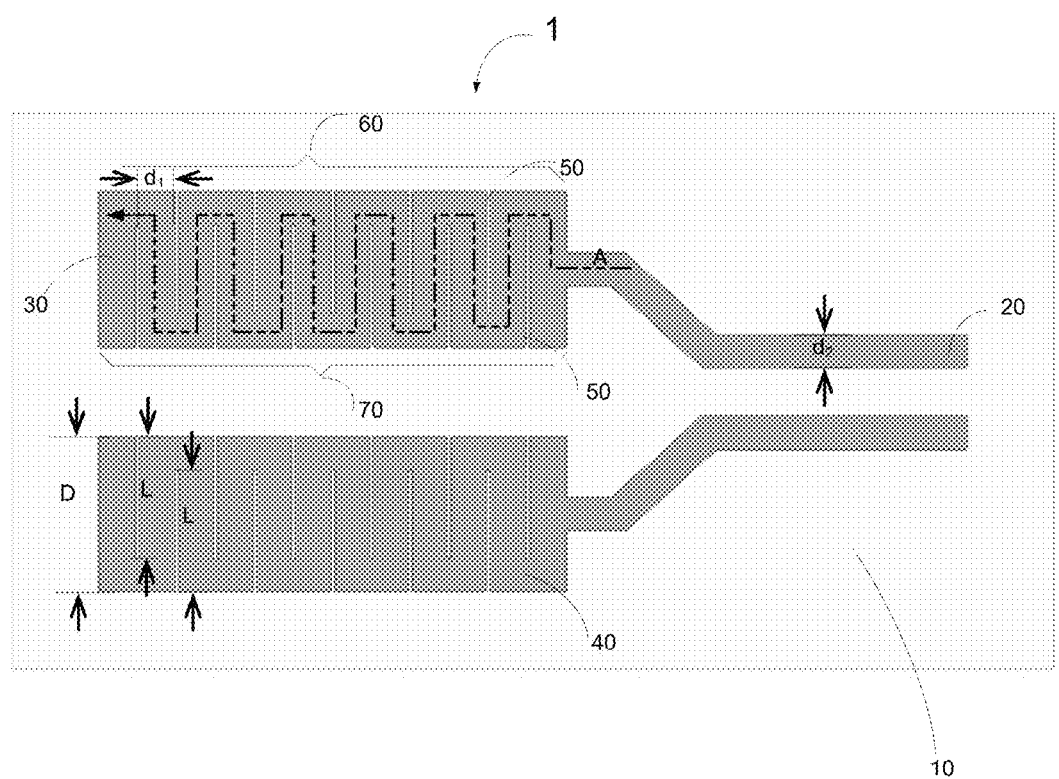
FIG. 1 is a schematic diagram of an embodiment of a golden finger (edge connector) structure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts have been exaggerated to better illustrate details and features of the present disclosure.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising," when utilized, means "including, but not necessarily limited to"; it specifically indicates open-ended inclusion or membership in the so-described combination, group, series, and the like.

The disclosure is described in relation to a golden finger (edge connector) structure.

FIG. 1 illustrates a golden finger structure 1. In at least one embodiment, the golden finger structure 1 comprises at least one golden finger set on a substrate 10 and at least one transmission line 20 coupled to the at least one the golden finger. In the embodiment, the golden finger structure 1 comprises a golden finger 30 and a golden finger 40 (two are shown as a non-limiting example). At least one slot 50 is set on the golden fingers 30 and 40, the at least one slot 50 is arranged up and down and adjacent slots 50 of the at least one slot 50 are arranged in an opposite direction. In at least one embodiment, the slots 50 are staggered. Each slot 50 comprises an opening. Openings of interphase slots 50 are on the same straight and openings of adjacent slots 50 are not on the same straight. In the embodiment, the number of slots 50 depends on a golden finger width and a transmission line width. In an exemplary embodiment, a formula for the number of slots 50 is:

$$N = \frac{Wg}{Wt} - 1$$

N expresses the number of slots 50, Wg expresses the golden finger width, and Wt expresses the transmission line width. For example, if the golden finger width is 5 mm and the transmission line width is 1 mm, four slots are set on each of the golden fingers 30 and the golden fingers 40.

In at least one embodiment, the at least one slot 50 is formed by digging out a corresponding area of the golden finger 30 and the golden finger 40.

Golden finger 30 is taken as an example in the embodiment. A spacing $d_1$ of adjacent slots 50 should be less than or equal to a transmission line width $d_2$ when the at least one slot 50 is set on the golden finger 30, in order to ensure that the impedance of the transmission line 20 and the golden finger 30 is continuous. In the embodiment, the spacing $d_1$ of the adjacent slots 50 may be slightly larger than the transmission line width $d_2$, but generally the width $d_1$ of the adjacent slots 50 is close to the transmission line width $d_2$. Thus the golden finger 30 can be regarded as a meandering transmission line having a width close to the transmission line width d2. When a signal is transmitted from the transmission line 20 to the golden finger 30, a transmission path of the signal on the golden finger is shown by a broken line A in FIG. 1. Since the golden finger 30 is divided by the at least one slot 50 to form the meandering transmission line and the meandering transmission line width is close to the transmission line 20 width, the impedance of the golden finger 30 is close to the impedance of the transmission line 20. Therefore, the transmission of the signal from the transmission line 20 to the golden finger 30 does not suffer from impedance discontinuity. In the embodiment, the shape of the slot 50 is polygonal, and the polygon is preferably rectangular.

In the embodiment, after being divided by the at least one slot 50, the golden finger 30 is meandering, and the meandering golden finger may be regarded as a plurality of coupled L-shaped pads.

Figure 2:
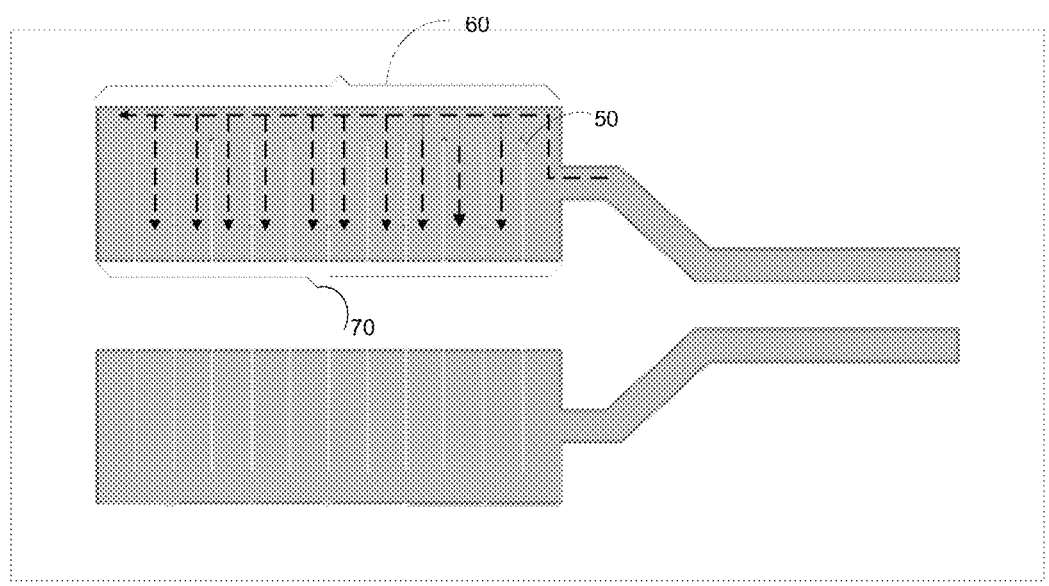
FIG. 2 is a schematic diagram of the golden finger structure of FIG. 1 when the slot is opened on the golden finger first long side.

In at least one embodiment, the golden finger 30 comprises a first long side 60 and a second long side 70. The opening of one of the adjacent slots 50 is set on the golden finger first long side 60 and the other slot is set on the second long side 70 opposite to the first long side 60. So that the signal is transmitted on the golden finger completely along the meandering path as shown in FIG. 1 without signal going along other path, thereby reducing the loss of signal transmission. As shown in FIG. 2 the openings of the adjacent slots are not set on the golden finger first long side 60 and the other opening set on the second long side 70 opposite to the first long side 60, but set on the golden finger first long side 60 or the golden finger second long side 70. The signal will be transmitted along a transmission path shown in the FIG. 2 when the signal is transmitted on the golden finger. The transmission path comprises at least one branch path and a primary transmission path, but the signal in the branch path transmission would have a stub effect, resulting in a serious attenuation of the signal.

In the embodiment, in order to better ensure that the impedance of the transmission line 20 and the golden finger 30 is continuous, a length L of the slot 50 is less than or equal to the difference between the width D of the golden finger and the width $d_2$ of the transmission line 20. In the embodiment, the length L of the slot 50 may be slightly larger than the difference between the width D of the golden finger and the width $d_2$ of the transmission line 20. Generally, the length L of the slot 50 is close to the difference between the golden finger width D and the transmission line 20 width. The width of the junction formed by the adjacent slots 50 is the same as or close to the transmission line 20 width, thus the impedance remains consistent when the signal is transmitted on the golden finger 30.

Figure 3A:
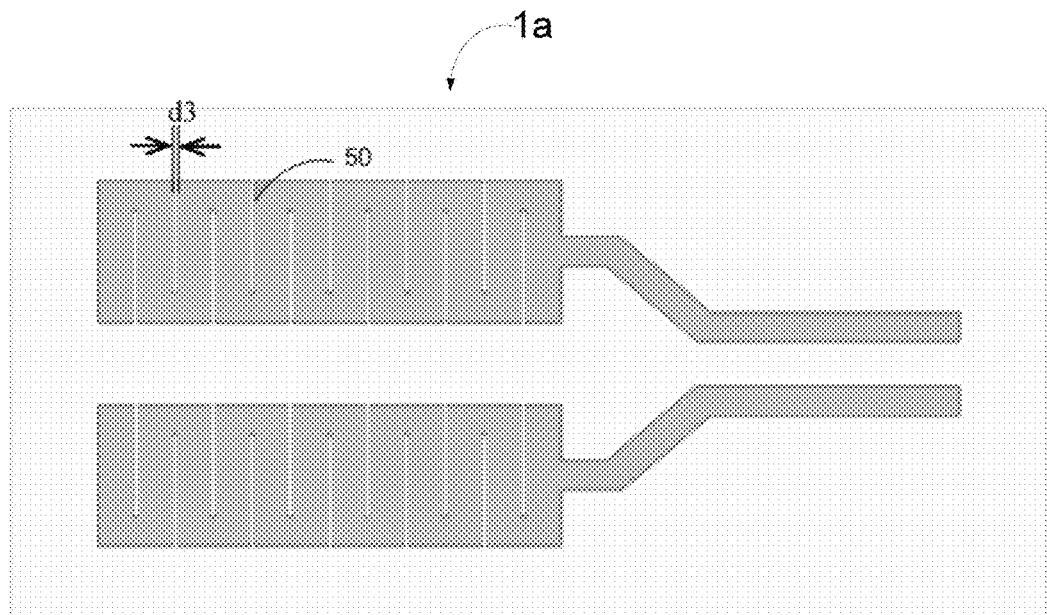
FIGS. 3A and 3B are schematic diagrams of the golden finger structure.
Figure 3B:
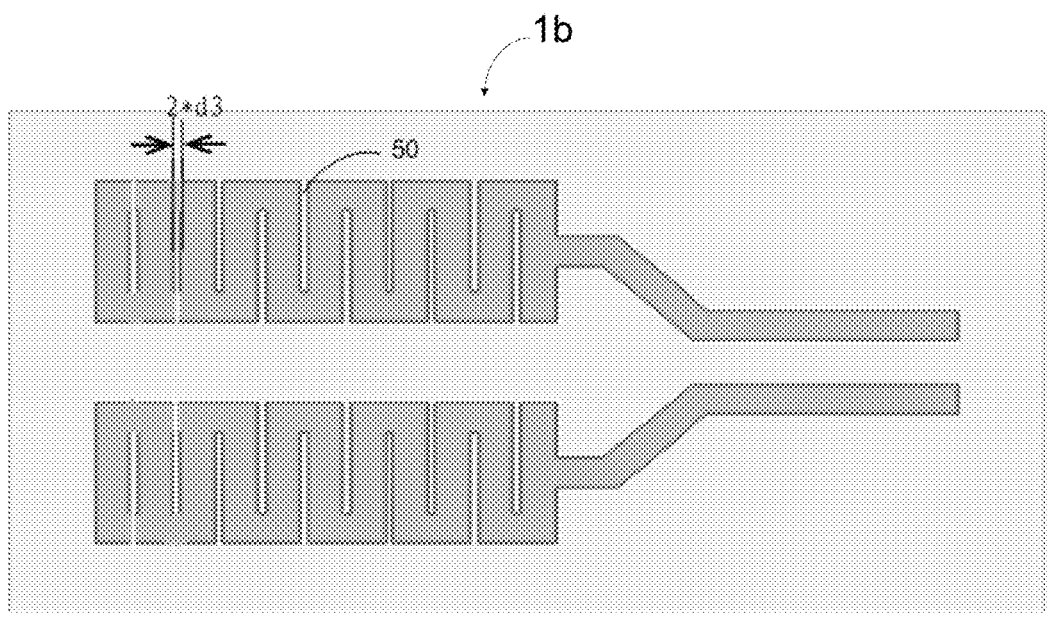

FIG. 3A illustrates a schematic diagram of the golden finger structure 1a. As shown in FIG. 3A, the slot width is $d_3$. FIG. 3B illustrates a golden finger structure 1b. As shown in FIG. 3B, the slot width is $2*d_3$.

Figure 4:
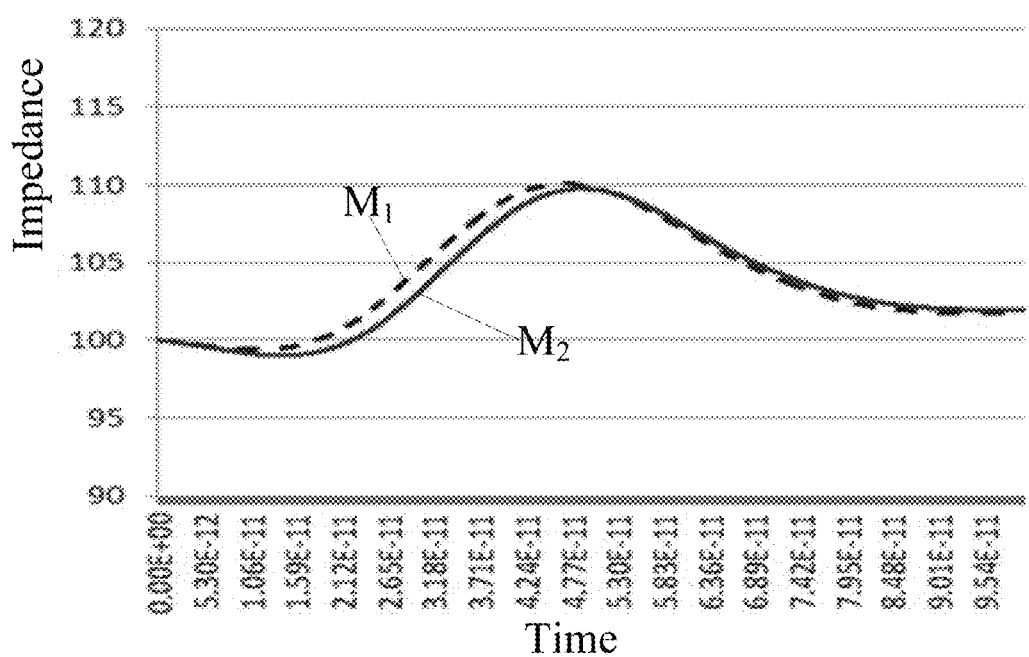
FIG. 4 is a diagram of an impedance simulation of the golden finger structure when the width of the slot is respectively $d_3$ and $2*d_3$.

FIG. 4 illustrates impedance simulation of the golden finger structure 1a and the golden finger structure 1b. Curve $M_1$ in FIG. 4 is a diagram of the impedance simulation of the golden finger structure 1a. Curve $M_2$ in FIG. 4 is a diagram of the impedance simulation of the golden finger structure 1b. As shown in FIG. 4, there is no obvious difference between impedances of the golden finger 30 on the golden finger structure 1a and the golden finger on the golden finger structure 1b. In other words, the width of the slot 50 does not affect the impedance of the golden finger 30. Thus, the width of the slot 50 is not limited, and the width of the slot 50 is set according to the actual requirement.

Figure 5A:
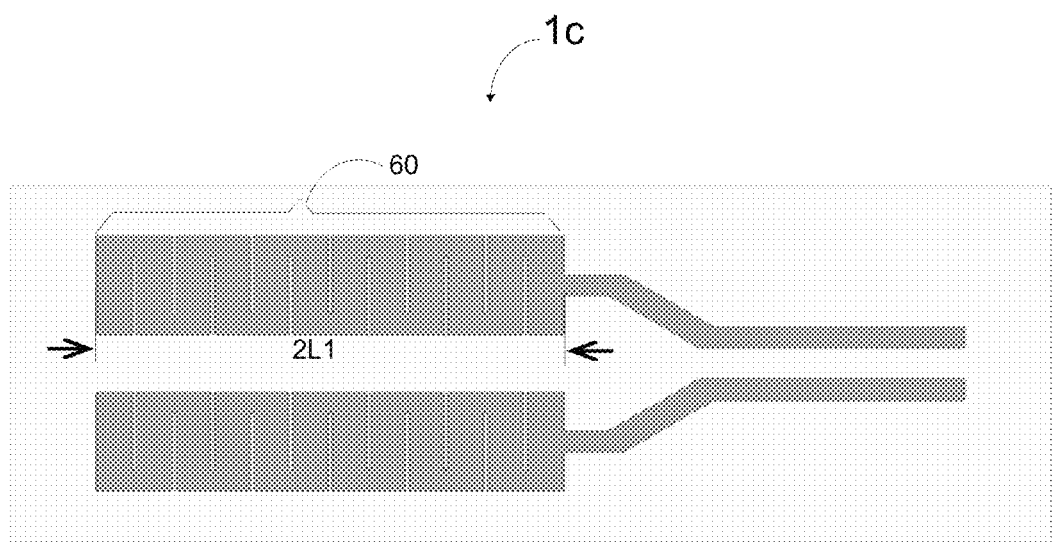
FIGS. 5A and 5B are schematic diagrams of the golden finger structure.
Figure 5:
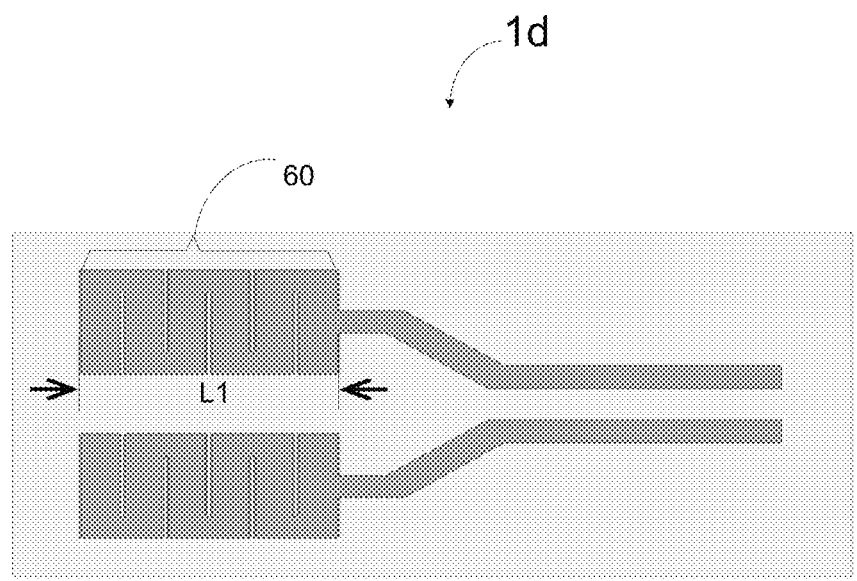

FIG. 5A illustrates golden finger structure 1c. As shown in FIG. 5A, the golden finger length is $2*L_1$. FIG. 5B illustrates a schematic diagram of the golden finger structure 1d. As shown in FIG. 5B, the golden finger length is $L_1$.

Figure 6:
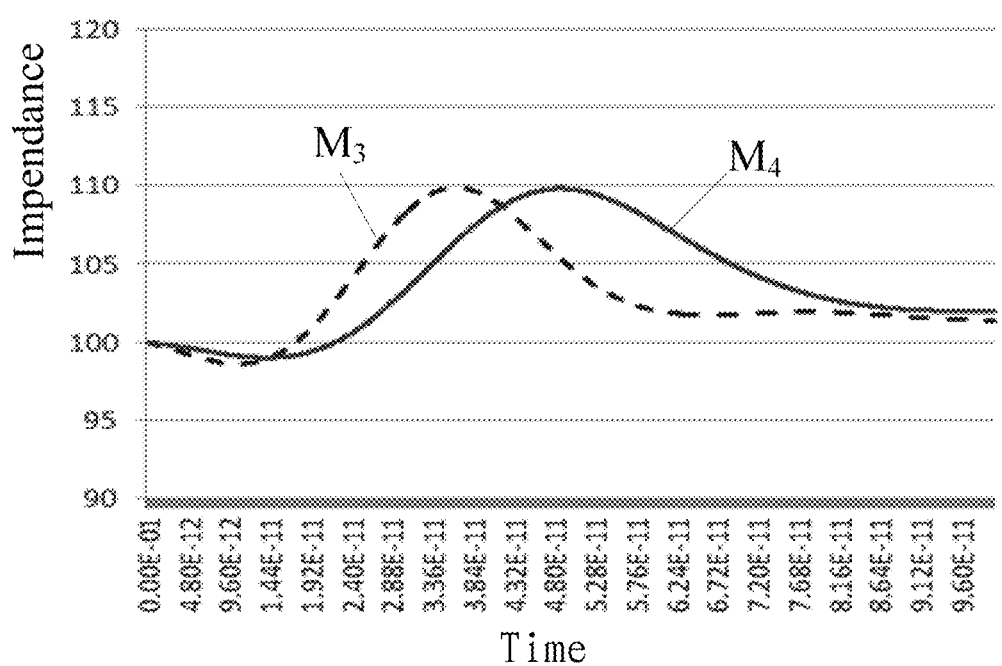
FIG. 6 is a diagram of an impedance simulation of the golden finger structure when the length of the golden finger is respectively $2*L_1$ and $L_1$.

FIG. 6 illustrates impedance simulation of the golden finger 1c and the golden finger structure 1d. Curve $M_3$ in FIG. 6 is the impedance simulation of the golden finger structure 1c, and curve $M_4$ in FIG. 6 is the impedance simulation of the golden finger structure 1d. As shown in FIG. 6, there is no obvious difference in the impedances of the golden finger 30 on the golden finger structure 1c and the golden finger structure 1d. Thus, the golden finger structure in the embodiment is applicable to all golden fingers and unrelated to the length of the golden finger.

Figure 7:
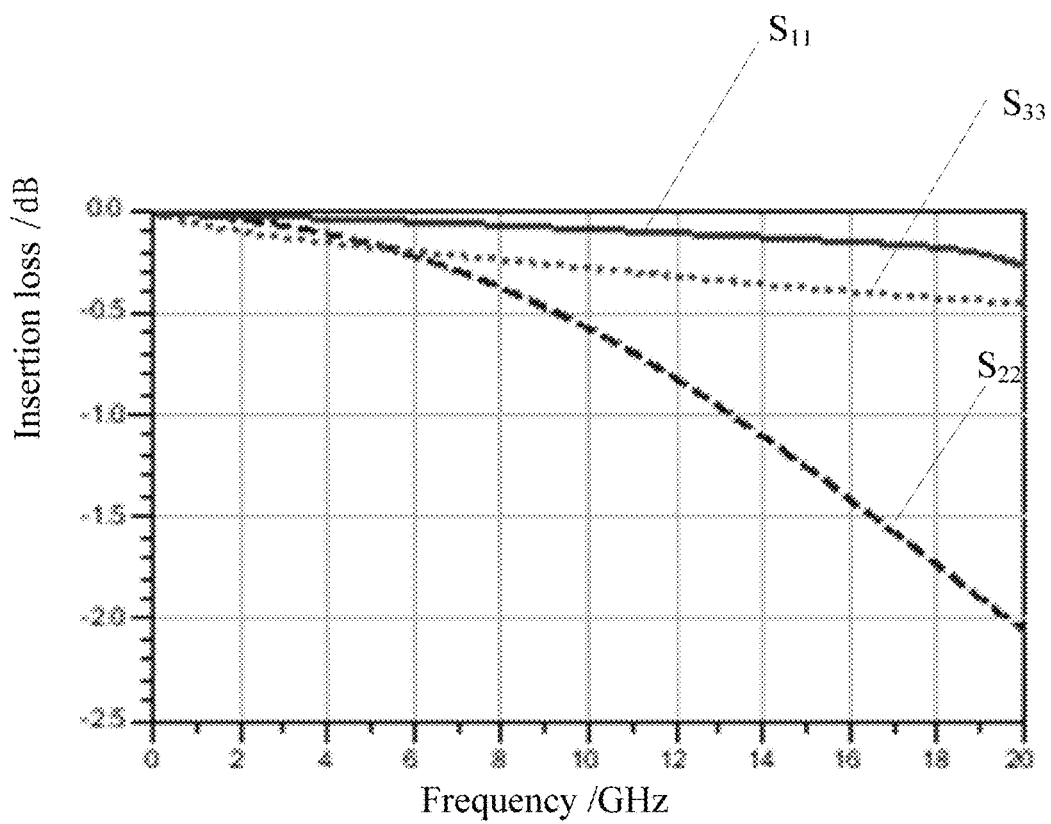
FIG. 7 is a diagram of an insertion loss simulation comparing the golden finger structure of the disclosure and of prior art.

FIG. 7 illustrates insertion loss simulation of the golden finger structure in the embodiment and in the prior art. A curve $S_{11}$ is the insertion loss simulation of the gold finger structure 1, and a curve $S_{22}$ is the insertion loss simulation of the golden finger structure 1 when the golden finger reference layer is not dug out. A curve $S_{33}$ is the insertion loss simulation of the golden finger structure when the golden finger reference layer is dug out. As shown in FIG. 7, the insertion loss value of the golden finger structure in the embodiment is smaller than the insertion loss value in the other structure, that is the transmission loss of the golden finger structure 1 is smaller than the other golden finger structures.

Figure 8:
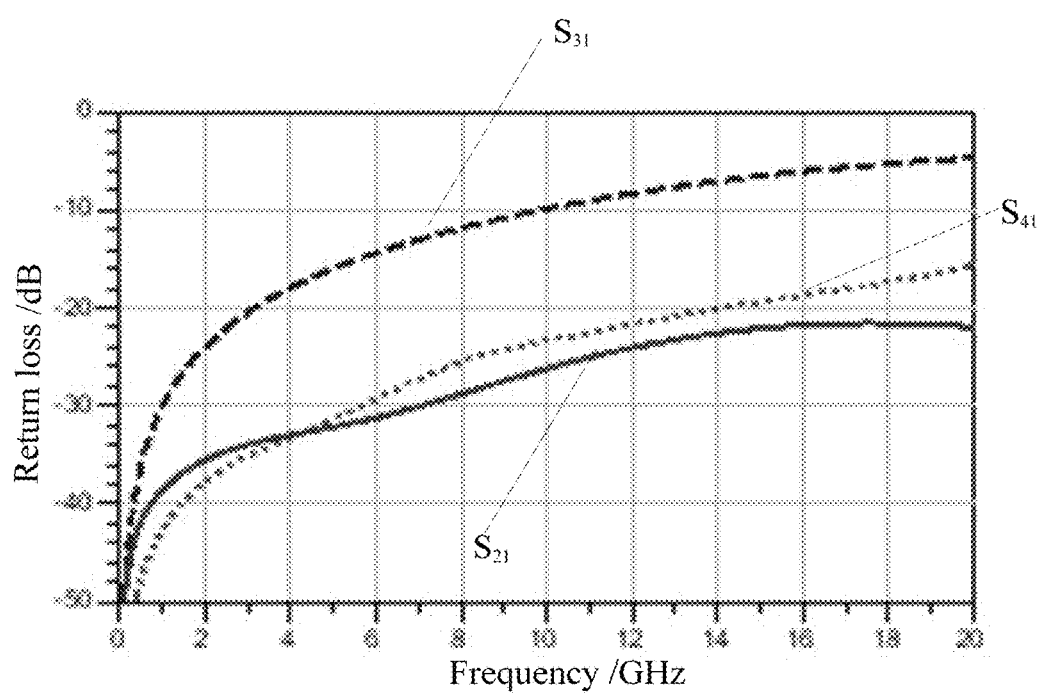
FIG. 8 is a diagram of a return loss simulation comparing the golden finger structure of the disclosure and of prior art.

FIG. 8 illustrates return loss simulation of the golden finger structure 1 and in the prior art. A curve $S_{21}$ is the return loss simulation of the gold finger structure 1, and a curve $S_{31}$ is the return loss simulation of the golden finger structure when the golden finger reference layer is not dug out. The curve $S_{41}$ is the return loss simulation of the golden finger structure when the golden finger reference layer is dug out. As shown in the FIG. 8, the return loss value of the golden finger structure 1 is lower than the return loss value in the other structures at most frequencies, that is, signal reflection of the golden finger structure 1 is smaller than the other golden finger structures.

As shown in the FIG. 7 and FIG. 8, the reduction of the insertion loss and the return loss of the golden finger structure 1 is better than the other golden finger structures, particularly in the higher frequencies.

Figure 9:
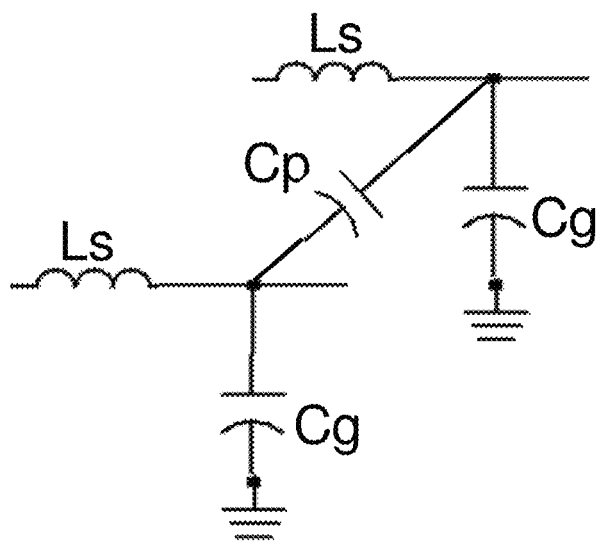
FIG. 9 is a diagram of an impedance equivalent circuit of the golden finger structure of the disclosure.
Figure 10:
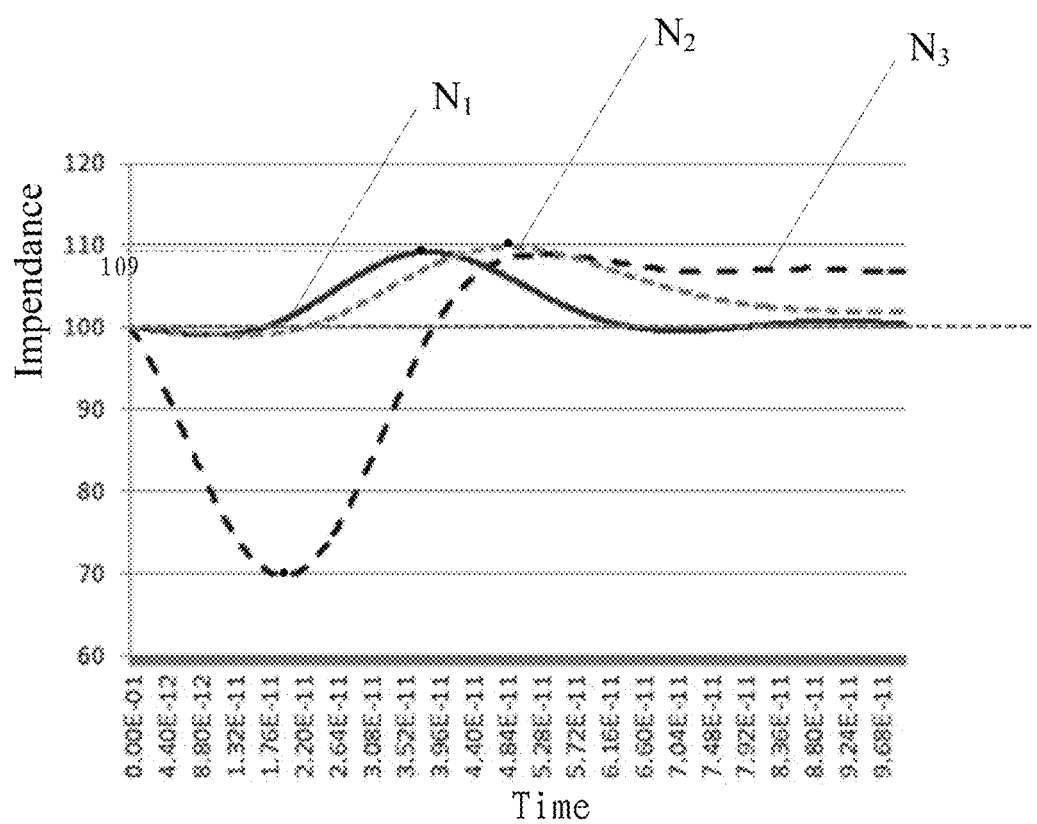
FIG. 10 is a diagram of an impedance simulation comparing the golden finger structure of the disclosure and of prior art.

FIG. 9 illustrates impedance equivalent circuit of the golden finger structure 1. The parameter $L_S$ is the inductance effect of the golden finger 30, Cp is the capacitive effect between adjacent golden fingers, Cg is the capacitance effect to ground of the golden finger. FIG. 10 illustrates impedance simulation of the golden finger structure 1 and in the prior art. The curve $N_1$ is impedance equivalent circuit of the gold finger structure 1, and the curve $N_2$ is a diagram of the impedance equivalent circuit of the golden finger structure when the golden finger reference layer is dug out. The curve $N_3$ is impedance equivalent circuit of the golden finger structure when the golden finger reference layer is not dug out. As can be seen from the FIG. 10, there is a 30 ohms capacitive change when the golden finger 30 reference layer is not dug out, and there is a 10 ohms inductive change when the golden finger reference layer is dug out. The golden finger structure 1 can achieve the same technical performance as the golden finger structure 1 when the golden finger 30 reference layer is dug out. It should be noted that the change of the impedance of the golden finger structure is within the range of −10 ohms to +10 ohms, the smaller the change the better. As can be seen from the FIG. 10, the change of the impedance of the golden finger structure in the invention is within the range.

In the golden finger structure illustrated, there is at least one slot on the golden finger, which is equivalent to reducing the width of the golden finger, and the impedance of the golden finger is increased so as to be close to the impedance of the transmission line, thereby solving the problem of impedance discontinuity. At the same time, since the golden finger structure 1 does not dig out the ground reference layer below the golden finger, various deficiencies caused by the traditional processing method can be avoided.

Many details are often found in the art such as the other features of the golden finger structure. Therefore, many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. A golden finger structure set on a substrate, comprising:
   at least one golden finger set on the substrate;
   at least one transmission line coupled to the at least one golden finger; and
   at least one slot set on the at least one golden finger, wherein the at least one slot is arranged up and down, and adjacent slots of the at least one slot are arranged in an opposite direction;
   wherein a width of the at least one slot is set according to a width of the at least one transmission line so that a spacing of the adjacent slots is less than or equal to the width of the at least one transmission line; and
   wherein a formula for a number of slots set on the at least one golden finger is:

$$N = \frac{Wg}{Wt} - 1,$$

wherein N expresses the number of the at least one slots, Wg expresses the width of the golden finger, and Wt expresses the width of the transmission line.

2. The golden finger structure of claim 1, wherein a shape of the slot is polygonal.

3. The golden finger structure of claim 2, wherein the polygon is rectangular.

4. The golden finger structure of claim 1, wherein each of the golden finger comprises a first long side and a second long side, one of the adjacent two slots is opened on the golden finger first long side and another one of the adjacent slots is opened on the second long side opposite to the first long side.

5. The golden finger structure of claim 4, wherein a length of the slot is less than or equal to a difference between the width of the golden finger and the width of the transmission line.

6. The golden finger structure of claim 1, wherein the golden finger is meandering.

7. The golden finger structure of claim 1, wherein the at least one slot is to divide the golden finger into a meandering transmission line, so that the impedance of the transmission line and the golden finger is continuous.

8. A golden finger structure set on a substrate, comprising:
   at least one golden finger set on the substrate;
   at least one transmission line coupled to the at least one golden finger; and
   at least one slot set on the at least one golden finger, wherein the at least one slot is arranged up and down, and adjacent slots of the at least one slot are arranged in an opposite direction;
   wherein a width of the at least one slot is set according to a width of the transmission line so that a spacing of the adjacent slots is less than or equal to the width of the transmission line; and
   wherein a formula for a number of slots set on the at least one golden finger is:

$$N = \frac{Wg}{Wt} - 1,$$

wherein N expresses the number of slots, Wg expresses the width of the golden finger, and Wt expresses the width of the transmission line.

9. The golden finger structure of claim 8, wherein the at least one slot is to divide the golden finger into a meandering transmission line, so that the impedance of the transmission line and the golden finger is continuous.

10. The golden finger structure of claim 8, wherein a shape of the slot is polygonal.

11. The golden finger structure of claim 10, wherein the polygon is rectangular.

12. The golden finger structure of claim 8, wherein each of the at least one golden finger comprises a first long side and a second long side, one of the adjacent slots is opened on the golden finger first long side and another one of the adjacent slots is opened on the second long side opposite to the first long side.

13. The golden finger structure of claim 12, wherein a length of the slot is less than or equal to a difference between the width of the golden finger and the width of the transmission line.

14. The golden finger structure of claim 8, wherein the golden finger is meandering.

15. A golden finger structure set on a substrate, comprising:
   at least one golden finger set on the substrate;
   at least one transmission line coupled to the at least one golden finger; and
   at least one slot set on the at least one golden finger, wherein the at least one slot is arranged up and down, and adjacent slots of the at least one slot are arranged in an opposite direction;
   wherein a formula for a number of the at least slots set on the at least one golden finger is:

$$N = \frac{Wg}{Wt} - 1,$$

wherein N expresses the number of the at least one slots, Wg expresses a width of the golden finger, and Wt expresses a width of the transmission line width.

* * * * *